United States Patent
Tanabe

(10) Patent No.: US 10,983,427 B2
(45) Date of Patent: Apr. 20, 2021

(54) METHOD FOR MANUFACTURING A MASK BLANK SUBSTRATE, METHOD FOR MANUFACTURING A MASK BLANK, METHOD FOR MANUFACTURING A TRANSFER MASK, METHOD FOR MANUFACTURING A SEMICONDUCTOR DEVICE, A MASK BLANK SUBSTRATE, A MASK BLANK, AND A TRANSFER MASK

(71) Applicant: HOYA CORPORATION, Tokyo (JP)

(72) Inventor: Masaru Tanabe, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 90 days.

(21) Appl. No.: 16/314,269

(22) PCT Filed: Jul. 10, 2017

(86) PCT No.: PCT/JP2017/025096
§ 371 (c)(1),
(2) Date: Dec. 28, 2018

(87) PCT Pub. No.: WO2018/020994
PCT Pub. Date: Feb. 1, 2018

(65) Prior Publication Data
US 2019/0227428 A1    Jul. 25, 2019

(30) Foreign Application Priority Data
Jul. 27, 2016 (JP) .............................. JP2016-147679

(51) Int. Cl.
*G03F 1/32* (2012.01)
*G03F 1/60* (2012.01)
*G03F 7/20* (2006.01)

(52) U.S. Cl.
CPC .................. *G03F 1/32* (2013.01); *G03F 1/60* (2013.01); *G03F 7/70716* (2013.01)

(58) Field of Classification Search
CPC ................. G03F 1/32; G03F 1/60; G03F 1/50
See application file for complete search history.

(56) References Cited

U.S. PATENT DOCUMENTS

2004/0192171 A1   9/2004  Koike
2005/0020083 A1   1/2005  Numanami et al.
(Continued)

FOREIGN PATENT DOCUMENTS

JP   2004-291209 A   10/2004
JP   2005-043838 A    2/2005
(Continued)

OTHER PUBLICATIONS

International Search Report for PCT/JP2017/025096 dated, Sep. 19, 2017 (PCT/ISA/210).

(Continued)

*Primary Examiner* — Stewart A Fraser
(74) *Attorney, Agent, or Firm* — Kilpatrick Townsend & Stockton LLP

(57) ABSTRACT

A mask blank substrate and a method for selecting a mask blank substrate wherein a square calculation region is set on the main surface of the substrate. Specific points are set at the corner portions of the calculation region. The heights of the specific points from a reference plane are acquired, an imaginary plane passing through three of the specific points is set, an intersection between the imaginary plane and a perpendicular line that passes through the remaining of the specific points and that is perpendicular to the reference plane is set, and the distance between the remaining of the specific points and the intersection is calculated. A substrate in which the distance satisfies a predetermined reference value is selected as a mask blank substrate.

12 Claims, 9 Drawing Sheets

(56) References Cited

U.S. PATENT DOCUMENTS

| | | | |
|---|---|---|---|
| 2006/0068300 A1 | 3/2006 | Tanabe et al. | |
| 2009/0233182 A1 | 9/2009 | Yamada et al. | |
| 2009/0274983 A1 | 11/2009 | Ogasawara | |
| 2010/0035028 A1 | 2/2010 | Tanabe | |
| 2011/0143267 A1 | 6/2011 | Harada et al. | |
| 2011/0171568 A1 | 7/2011 | Sasaki et al. | |
| 2014/0234755 A1* | 8/2014 | Sasaki | G03F 1/38 430/5 |
| 2015/0017574 A1 | 1/2015 | Orihara et al. | |
| 2016/0041461 A1 | 2/2016 | Hirabayashi | |
| 2016/0109797 A1* | 4/2016 | Tanabe | C03C 15/02 430/5 |
| 2017/0277034 A1 | 9/2017 | Ikenoya et al. | |

FOREIGN PATENT DOCUMENTS

| | | |
|---|---|---|
| JP | 2006133629 A | 5/2006 |
| JP | 2006176341 A | 7/2006 |
| JP | 2009-272387 A | 11/2009 |
| JP | 2010-078769 A | 4/2010 |
| JP | 2011-141536 A | 7/2011 |
| JP | 2011-207757 A | 10/2011 |
| JP | 2012-185505 A | 9/2012 |
| JP | 2012-208509 A | 10/2012 |
| JP | 2012-256066 A | 12/2012 |
| JP | 2014-038333 A | 2/2014 |
| JP | 2014-149351 A | 8/2014 |
| JP | 2014-209200 A | 11/2014 |
| JP | 2016-004821 A | 1/2016 |
| JP | 2016-038573 A | 3/2016 |
| JP | 2016048379 A | 4/2016 |
| JP | 2017182055 A | 10/2017 |
| JP | 6293986 B1 | 3/2018 |
| KR | 20060051685 A | 5/2006 |

OTHER PUBLICATIONS

KR10-2018-7036514, "Notification of Reason for Refusal" with Machine Translation, May 19, 2020, 38 pages.

Notification of Reasons for Refusal dated Jan. 11, 2019 from the Japanese Patent Office in application No. 2018-022915.

Notification of Reason for Refusal of Application dated Jul. 15, 2019 in Taiwanese Application No. 106124068.

* cited by examiner

A1 : 132mm (a)

(a')

(b)

(b')

(c)

(c')

A2 : 132mm (a)

(a')

(b)

(b')

(c)

(c')

B1 : 132mm (a)

(a')

(b)

(b')

(c)

(c')

A3 : 146mm (a)

(a')

(b)

(b')

(c)

(c')

A4 : 146mm (a)

(a')

(b)

(b')

(c)

(c')

B2 : 146mm (a)

(a')

(b)

(b')

(c)

(c')

METHOD FOR MANUFACTURING A MASK BLANK SUBSTRATE, METHOD FOR MANUFACTURING A MASK BLANK, METHOD FOR MANUFACTURING A TRANSFER MASK, METHOD FOR MANUFACTURING A SEMICONDUCTOR DEVICE, A MASK BLANK SUBSTRATE, A MASK BLANK, AND A TRANSFER MASK

CROSS REFERENCE TO RELATED APPLICATIONS

This application is a National Stage of International Application No. PCT/JP2017/025096 filed Jul. 10, 2017, claiming priority based on Japanese Patent Application No. 2016-147679, filed Jul. 27, 2016.

TECHNICAL FIELD

This invention relates to a method for manufacturing a mask blank substrate, a method for manufacturing a mask blank, a method for manufacturing a transfer mask, a method for manufacturing a semiconductor device, a mask blank substrate, a mask blank, and a transfer mask.

BACKGROUND ART

In recent years, an increase in high NA (Numerical Aperture) in an exposure apparatus using an ArF exposure light is in progress to deal with the miniaturization of semiconductor devices, and further increase in high NA is in progress by introduction of liquid immersion exposure technique. Higher NA in an exposure apparatus causes improvements in resolution in exposure-transferring a fine pattern provided on a transfer mask on a resist film on a wafer. In a step-and-scanning type exposure apparatus, an exposure light scans over a transfer mask and a wafer so as to exposure-transfer a transfer pattern on the transfer mask on a resist film on the wafer.

However, without adjusting a focus of a transfer mask face and a wafer face during scanning, a focus error occurs and causes a significant deviation of an image forming position from the best focus so that resolution of the transfer pattern on the resist film is significantly reduced.

As disclosed in Publication 1, along with the increase in NA of the exposure apparatus, depth of focus (DOF) is decreasing. Since tolerance of deviation from the best focus becomes small when a depth of focus is small, it is becoming increasingly important to control the focus. Further, as disclosed in Publication 2, it is necessary to bring a flatness of a transfer mask (substrate) upon exposure transfer in a good condition to reduce a focus error that is likely to occur due to reduced depth of focus. Publication 2 describes that a preferable shape of a top surface (main surface) for forming a mask pattern (transfer pattern) of a substrate for a photomask blank (substrate of transfer mask) is that when a pair of strip-like regions (or quadrangular ring-shaped region) is set on the top surface, each of the strip-like regions (or quadrangular ring-shaped region) is inclined downward toward the outer periphery of the substrate, and which has a difference between maximum and minimum values for height in the strip-like regions (or quadrangular ring-shaped region) of 0.5 μm or less.

PRIOR ART PUBLICATIONS

Patent Publications

Publication 1
Japanese Patent Application Publication 2009-272387
Publication 2
Japanese Patent Application Publication 2005-043838

SUMMARY OF THE INVENTION

Problems to be Solved by the Invention

A substrate for a transfer mask (mask blank substrate) disclosed Publication 2 is a mask blank substrate that is applicable to a transfer mask having a fine pattern that is difficult to be resolved on a resist film on a wafer without the use of an exposure apparatus with high NA.

Such a mask blank substrate is a high-spec substrate with a main surface (one surface on the side to which a thin film for a transfer pattern is provided) having high flatness and further satisfying strict conditions on the shape of the main surface. In the case of manufacturing a mask blank substrate by a conventional method where the step of simultaneously polishing both surfaces of a plurality of substrates is carried out in a plurality of stages, a ratio of acquiring the high-spec mask blank substrate is small. Therefore, the high-spec mask blank substrate is generally expensive compared to other substrates for a mask blank.

Generally, a semiconductor device is manufactured by repeating the steps of forming a layer and a resist film on a wafer, exposure-transferring a pattern to the resist film by a transfer mask, developing the resist film to form a resist pattern, and forming a pattern on the layer by etching using the resist pattern as a mask. Therefore, at least one transfer mask is required for each layer. To manufacture a semiconductor device, it is necessary to manufacture a set of transfer masks including all transfer masks for each layer of the semiconductor device as a set.

Not all layers of a semiconductor device have a fine pattern that is difficult to be resolved on a resist film on a wafer without the use of an exposure apparatus with high NA. There are also layers having a relatively sparse pattern. Therefore, a set of transfer masks includes a transfer mask with such a fine pattern and a transfer mask having a relatively sparse transfer pattern in combination. A transfer mask having such a relatively sparse transfer pattern is capable of resolving a pattern on a resist film on a wafer, even if the transfer mask is manufactured from a non-high-spec mask blank substrate, i.e., from a mask blank substrate with rather low flatness.

However, when a transfer mask having a relatively sparse transfer pattern thus manufactured using a non-high-spec mask blank substrate is set on a mask stage of an exposure apparatus with high NA and is exposure-transferred on a resist film on a wafer, a focus error is likely to occur, which has been a problem. On the other hand, an investigation is being made on manufacturing a transfer mask having a rather fine transfer pattern using a non-high-spec mask blank substrate by setting the transfer mask on a mask stage of an exposure apparatus with high NA. In this case as well, when the transfer mask is set on a mask stage of an exposure apparatus with high NA and is exposure-transferred on a resist film on a wafer, a focus error is likely to occur, which has been a problem.

Means for Solving the Problem

As means for solving the above problem, this invention includes the following structures.

(Structure 1)

A method for manufacturing a mask blank substrate used for manufacturing a mask blank provided with a thin film for a transfer pattern on one main surface of a substrate having a pair of opposing main surfaces, including the steps of:

setting a calculation region on one main surface of the substrate, which is a square region including at least a square region having a side of 132 mm based on a center of the substrate, and setting a specific point for each of four corner portions in the calculation region;

acquiring a height from a base plane for all of the specific points;

setting an imaginary plane passing through three of all of the specific points, setting an intersection of the imaginary plane and a perpendicular line that passes through a remaining specific point and which is perpendicular to the base plane, and calculating a distance between the remaining specific point and the intersection; and selecting a substrate having the distance thus calculated of less than 0.2 µm as a mask blank substrate.

(Structure 2)

The method for manufacturing a mask blank substrate according to Structure 1, in which the calculation region is equal to or smaller than a square region having a side of 146 mm based on a center of the substrate.

(Structure 3)

The method for manufacturing a mask blank substrate according to Structure 1 or 2 in which, when a plurality of measurement points is set in the calculation region of one main surface of the substrate and a height from the base plane of the measurement point is acquired, difference obtained by subtracting minimum value from maximum value of height from the base plane at the specific point and the measurement point in the calculation region is greater than 0.2 µm.

(Structure 4)

The method for manufacturing a mask blank substrate according to any one of Structures 1 to 3, in which the base plane is a least square plane approximated by least squares method based on a height information of the measurement point based on a reference plane of a profilometer acquired by setting a plurality of measurement points in the calculation region of one main surface of the substrate and measuring with the profilometer.

(Structure 5)

The method for manufacturing a mask blank substrate according to any one of Structures 1 to 4, in which the one main surface has a root mean square roughness Rq of 0.25 nm or less.

(Structure 6)

A method for manufacturing a mask blank including the step of providing the thin film for the transfer pattern on the one main surface of a mask blank substrate manufactured by the method for manufacturing a mask blank substrate according to any one of Structures 1 to 5.

(Structure 7)

A method for manufacturing a mask blank provided with a thin film for a transfer pattern on one main surface of a substrate having a pair of opposing main surfaces, including the steps of:

setting a calculation region on a surface of the thin film of a substrate provided with the thin film, which is a square region including at least a square region having a side of 132 mm based on a center of the substrate, and setting a specific point for each of four corner portions in the calculation region;

acquiring a height from a base plane for all of the specific points;

setting an imaginary plane passing through three of all of the specific points, setting an intersection of the imaginary plane and a perpendicular line that passes through a remaining specific point and which is perpendicular to the base plane, and calculating a distance between the remaining specific point and the intersection; and selecting a substrate provided with the thin film having the distance thus calculated of less than 0.2 µm as a mask blank.

(Structure 8)

The method for manufacturing a mask blank according to Structure 7, in which the calculation region is equal to or smaller than a square region having a side of 146 mm based on a center of the substrate.

(Structure 9)

The method for manufacturing a mask blank according to Structure 7 or 8 in which, when a plurality of measurement points is set in the calculation region of a surface of the thin film and a height from the base plane of the measurement point is acquired, difference obtained by subtracting minimum value from maximum value of height from the base plane at the specific point and the measurement point in the calculation region is greater than 0.2 µm.

(Structure 10)

The method for manufacturing a mask blank according to any one of Structures 7 to 9, in which the base plane is a least square plane approximated by least squares method based on a height information of the measurement point based on a reference plane of a profilometer acquired by setting a plurality of measurement points in the calculation region of a main surface of the thin film and measuring with the profilometer.

(Structure 11)

A method for manufacturing a transfer mask including the step of forming a transfer pattern on the thin film of a mask blank manufactured by the method for manufacturing a mask blank according to any one of Structures 6 to 10.

(Structure 12)

A mask blank substrate used for manufacturing a mask blank provided with a thin film for a transfer pattern on one main surface of a substrate having a pair of opposing main surfaces, in which the substrate is such that in setting a calculation region on one main surface of the substrate, which is a square region including at least a square region having a side of 132 mm based on a center of the substrate, setting a specific point for each of four corner portions in the calculation region, acquiring a height from a base plane for all of the specific points, setting an imaginary plane passing through three of all of the specific points, setting an intersection of the imaginary plane and a perpendicular line that passes through a remaining specific point and which is perpendicular to the base plane, and calculating a distance between the remaining specific point and the intersection, the distance thus calculated is less than 0.2 µm.

(Structure 13)

The mask blank substrate according to Structure 12, in which the calculation region is equal to or smaller than a square region having a side of 146 mm based on a center of the substrate.

(Structure 14)

The mask blank substrate according to Structure 12 or 13 in which, when a plurality of measurement points is set in the calculation region of one main surface of the substrate and a height from the base plane of the measurement point is acquired, difference obtained by subtracting minimum value from maximum value of height from the base plane at the specific point and the measurement point in the calculation region is greater than 0.2 μm.

(Structure 15)

The mask blank substrate according to any one of Structures 12 to 14, in which the base plane is a least square plane approximated by least squares method based on a height information of the measurement point based on a reference plane of a profilometer acquired by setting a plurality of measurement points in the calculation region of one main surface of the substrate and measuring with the profilometer.

(Structure 16)

The mask blank substrate according to any one of Structures 12 to 15, in which the one main surface has a root mean square roughness Rq of 0.25 nm or less.

(Structure 17)

A mask blank including the thin film for the transfer pattern on the one main surface of a mask blank substrate according to any one of Structures 12 to 16.

(Structure 18)

A mask blank provided with a thin film for a transfer pattern on one main surface of a substrate having a pair of opposing main surfaces, in which the mask blank is such that in setting a calculation region on a surface of the thin film, which is a square region including at least a square region having a side of 132 mm based on a center of the substrate, setting a specific point for each of four corner portions in the calculation region, acquiring a height from a base plane for all of the specific points, setting an imaginary plane passing through three of all of the specific points, setting an intersection of the imaginary plane and a perpendicular line that passes through a remaining specific point and which is perpendicular to the base plane, and calculating a distance between the remaining specific point and the intersection, the distance thus calculated is less than 0.2 μm.

(Structure 19)

The mask blank according to Structure 18, in which the calculation region is equal to or smaller than a square region having a side of 146 mm based on a center of the substrate.

(Structure 20)

The mask blank according to Structure 18 or 19 in which, when a plurality of measurement points is set in the calculation region of a surface of the thin film and a height from the base plane of the measurement point is acquired, difference obtained by subtracting minimum value from maximum value of height from the base plane at the specific point and the measurement point in the calculation region is greater than 0.2 μm.

(Structure 21)

The mask blank according to any one of Structures 18 to 20, in which the base plane is a least square plane approximated by least squares method based on a height information of the measurement point based on a reference plane of a profilometer acquired by setting a plurality of measurement points in the calculation region of a main surface of the thin film and measuring with the profilometer.

(Structure 22)

A transfer mask provided with a transfer pattern on the thin film of the mask blank according to any one of Structures 17 to 21.

(Structure 23)

A method for manufacturing a semiconductor device including setting a transfer mask manufactured by the method for manufacturing a transfer mask according to Structure 11 on a mask stage of an exposure apparatus, and transferring a transfer pattern of the transfer mask on a semiconductor substrate by a lithography method.

(Structure 24)

A method for manufacturing a semiconductor device including setting a transfer mask according to Structure 22 on a mask stage of an exposure apparatus, and transferring a transfer pattern of the transfer mask on a semiconductor substrate by a lithography method.

Effect of the Invention

According to the method for manufacturing a mask blank substrate or the method for manufacturing a mask blank of this invention, a transfer mask manufactured using the mask blank substrate or the mask blank manufactured through these manufacturing methods has less chance of focus error occurrence when exposure-transferred using an exposure apparatus with high NA. Further, according to the mask blank substrate or the mask blank of this invention, a transfer mask manufactured using the mask blank substrate or the mask blank has less chance of focus error occurrence when exposure-transferred using an exposure apparatus with high NA.

EMBODIMENTS OF THE INVENTION

Figure 1:
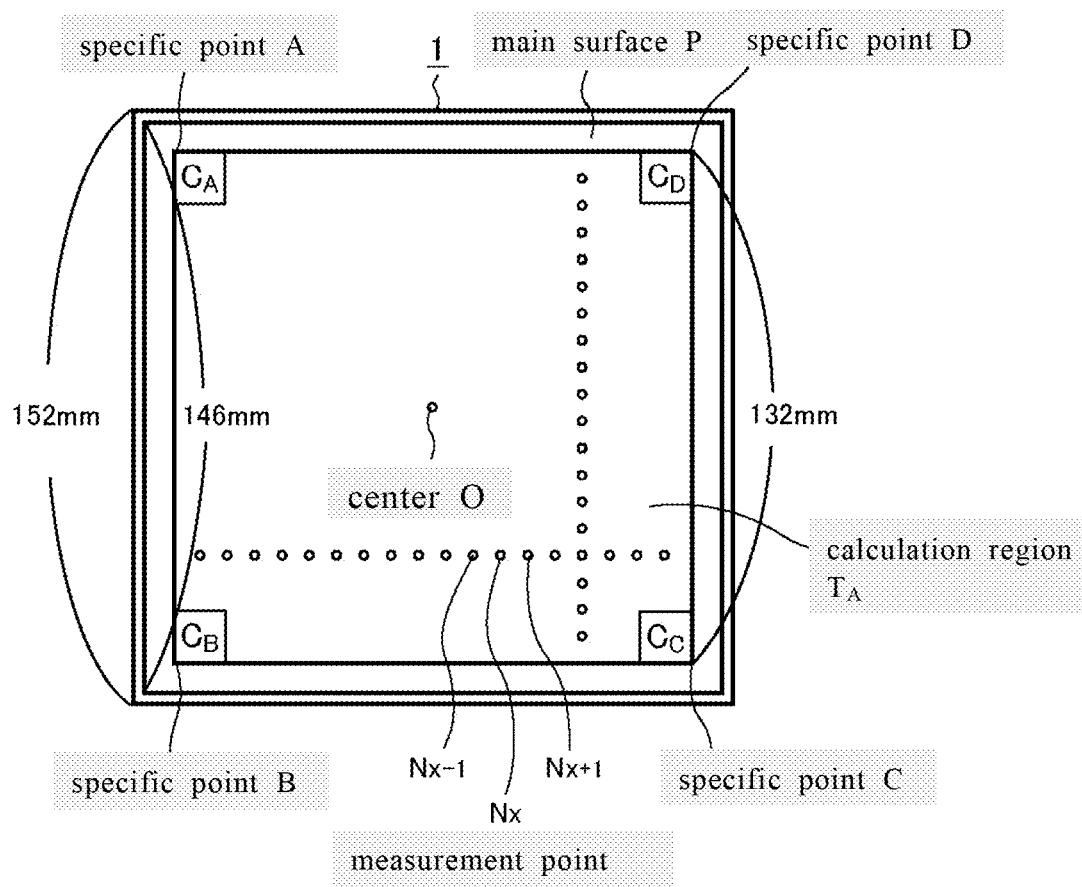
FIG. 1 is a schematic plan view showing an example of a main surface and a calculation region of a substrate in an embodiment of this invention.

[Method for Manufacturing Mask Blank Substrate and Mask Blank Substrate]

Explanation is made herein on a method for manufacturing a mask blank substrate and a mask blank substrate. First, a structural concept of this invention is explained followed by examples carried out based on the concept along with comparative examples.

The inventors of this invention made diligent studies on means for manufacturing a relatively sparse transfer pattern or a transfer mask having a rather fine transfer pattern without using a high-spec mask blank substrate, and that can inhibit focus error occurrence even if the transfer mask is set on a high-NA exposure apparatus and exposure-transferred on a resist film on a wafer.

Generally, a surface profile of a main surface of a substrate is substantially square, which is acquired using a profilometer (surface profile analyzer). The profilometer used in this case is to acquire a surface profile of an object to be measured by irradiating an entire measurement region of the object to be measured with an inspection light having strong tendency of coherence such as a laser light, creating an interference fringe image between a light reflected on a surface of the object to be measured and a light reflected by a reference surface having a high flatness, and analyzing the interference fringe image.

Measurement of a surface profile of a substrate using a profilometer is carried out through the following method. First, an interference fringe image obtained through the above method is subjected to analysis, etc. by arranging measurement points in grids on a main surface of the substrate to acquire height information of each measurement point (plane forming the basis at this point is, e.g., reference plane of measurement apparatus). Next, based on the height information of each measurement point, an approximating surface is calculated by a least squares method (least square plane), which is regarded as a base plane. Next, the height information of each measurement point is converted into height of each measurement point based on the base plane (least square plane), and the result is regarded as information of the surface profile in each measurement point.

Conventionally, a flatness of a main surface of a substrate (one of the main surfaces to which a thin film for transfer pattern formation is provided) is used as an index to sort high-spec substrates and non-high-spec substrates. The flatness used is acquired by defining a predefined region at least including a region where a transfer pattern is formed when a transfer mask is manufactured on a main surface of a substrate, and calculating, from information of a surface profile which is a height of each measurement point based on the least square plane, TIR (Total Indicator Reading) value which is a difference between a maximum height and a minimum height in the predefined region, which is used as the flatness. When a transfer mask manufactured by a high-spec substrate having high flatness is set on a mask stage of an exposure apparatus with high NA and exposure-transferred on a resist film on a wafer, a focus error is unlikely to occur.

On the other hand, the inventors of this invention made a verification of the tendency of focus error occurrence on a plurality of substrates regarded as non-high-spec under the flatness index by using these substrates to manufacture transfer masks having same transfer pattern, setting the transfer masks on a mask stage of an exposure apparatus with high NA, and exposure-transferring on a resist film on a wafer. As a result, it was found that there are transfer masks where a focus error is likely to occur and unlikely to occur among those using substrates of substantially the same flatness. Namely, it was found as difficult to newly provide a reference value for selecting a substrate where a focus error is unlikely to occur among non-high-spec substrates with a conventionally used index of flatness.

Next, the inventors of this invention made further investigation on the difference of tendency on each surface profile of substrates where a focus error is likely to occur and those where focus error is unlikely to occur (However, the each surface profile of substrates has substantially the same flatness). As a result, the inventors discovered that a surface profile (approximately square) of a main surface of a substrate where a focus error is unlikely to occur has a tendency that inclinations from the center toward each corner portion are close at four corner portions; whereas a surface profile (substantially square) of a substrate where a focus error is likely to occur has a tendency that inclinations from the center toward the corner portions differ at least in any one of the corner portions. An exposure apparatus with high NA is adjusted in irradiation conditions so as to approach the best focus at each scanning position during scan irradiation of an exposure light on a transfer mask. On a main surface profile that tends to be unbalanced in diagonal direction as in a substrate where a focus error is likely to occur, the difficulty in adjustment of the irradiation conditions is inferred as a factor for a focus error being likely to occur.

A study was made on new criteria for selecting a substrate where such a focus error is unlikely to occur. In examining by a selecting criterion including defining a surface profile of a main surface of a substrate by a height based on a least square plane at each measurement point, setting a measurement point (specific point) for each of four corner portions of the substrate, and all values of height in the specific points of the four corner portions based on the least square plane are at a predetermined value or less, the selected substrate was a substrate where focus error is unlikely to occur. However, a rather large number of substrates where a focus error is unlikely to occur existed in the substrates that were not selected by this selecting criterion. In this selecting criterion, many of the substrates that should be selected as a substrate where a focus error is unlikely to occur will be out of the selection.

In the case of a selecting criterion where all of each value of height of the specific points at the four corner portions are at a predetermined value or less, a substrate with a main surface profile having a simple inclination from one end surface of a main surface of the substrate to an end surface opposing the one end surface will be out of the selection when the inclination is large. However, a substrate having a main surface with such a surface profile can be regarded as a substrate where a focus error is unlikely to occur, since correction can be made relatively easily by a tilt correcting mechanism of an exposure apparatus. It is necessary that the selecting criterion selects substrates having such a tendency of a main surface as substrates where a focus error is unlikely to occur.

As a result of further study, the inventors of this invention noticed that it is favorable to use a criterion for selecting a substrate where a focus error is unlikely to occur, including setting an imaginary plane passing through three of the four specific points of the main surface, calculating a distance between the remaining one specific point and the imaginary plane (specifically, distance based on a perpendicular direction to the least square plane), and using the calculated distance as the selecting criterion. With regard to a substrate where the calculated distance is large, when a transfer mask manufactured from the substrate is set on a mask stage of an exposure apparatus with high NA and three of the four corner portions of the substrate contact a chuck surface of the mask stage, the remaining one corner portion is likely to float from the chuck surface. When a transfer mask set under such a condition is subjected to scan exposure, it is difficult to correct the focus such as by adjustment of illumination condition and a focus error is likely to occur. This tendency is significant in an exposure apparatus with high NA where a soft chuck is employed, which is a chuck method with rather weak force to chuck a transfer mask of the mask stage.

The distance thus calculated is hereafter referred to as "floating distance" for convenience.

On the other hand, with regard to a substrate where the distance calculated as above is small, when a transfer mask manufactured from the substrate is set on a mask stage of an exposure apparatus with high NA and three of the four corner portions of the substrate contact a chuck surface of the mask stage, the remaining one corner portion is unlikely to float from the chuck surface, and even if it floats, the amount is small. When a transfer mask set under such a condition is subjected to scan exposure, it is sufficiently possible to correct the focus such as by adjustment of illumination condition and a focus error is unlikely to occur. Incidentally, a transfer mask manufactured using a high-spec substrate with high flatness has a significantly small difference between maximum value and minimum value of height based on least square plane at each measurement point of a main surface of the substrate. Therefore, when a transfer mask manufactured from the high-spec substrate is set on a mask stage of an exposure apparatus with high NA and three of the four corner portions of the substrate contact a chuck surface of the mask stage, floating itself of the remaining one corner portion from the chuck surface hardly occurs.

The method for manufacturing a mask blank substrate completed as a result of the diligent study described above is a method for manufacturing a mask blank substrate used for manufacturing a mask blank provided with a thin film for a transfer pattern on one main surface of a substrate having a pair of opposing main surfaces, including the steps of setting a calculation region on one main surface of the substrate, which is a square region including at least a square region having aside of 132 mm based on a center of the substrate, and setting a specific point for each of four corner portions in the calculation region; acquiring a height from a base plane for all of the specific points; setting an imaginary plane passing through three of all of the specific points, setting an intersection of the imaginary plane and a perpendicular line that passes through a remaining specific point and which is perpendicular to the base plane, and calculating a distance between the remaining specific point and the intersection; and selecting a substrate having the distance thus calculated of less than 0.2 μm as a mask blank substrate.

Embodiments of the method for manufacturing a mask blank substrate are explained below in greater detail. First, a shape of a mask blank substrate is cut out from a glass ingot, followed by a grinding step for grinding a main surface, an end surface, and a chamfered surface of the substrate that was cut out, and subsequently a polishing step for precisely polishing the surfaces of the main surface, end surface, and chamfered surface. The polishing step of the main surface is normally carried out in multiple stages. Although various polishing methods can be employed and are not particularly limited herein, a preferable polishing step is simultaneously polishing two main surfaces of the substrate using polishing agents such as ceric oxide and subsequently polishing the two main surfaces of the substrate using polishing agents such as colloidal silica. The substrate that went through such a multistage polishing step has a main surface with a flatness of a predetermined degree or higher, and is a mirror surface having reduced surface roughness.

Materials for the mask blank substrate are not particularly limited, as long as the materials have a high transmittance to an exposure light. Synthetic quartz glass, soda-lime glass, aluminosilicate glass, borosilicate glass, non-alkali glass, calcium fluoride, etc. can be used for the materials of the substrate. Among these materials, synthetic quartz glass is particularly preferable for the mask blank substrate of this invention used in an exposure apparatus with high NA for having high transmittance to ArF excimer laser or at a region having shorter wavelength than the ArF excimer laser.

Next, the step of setting a calculation region on one of the main surfaces of the substrate (main surface at the side on which a thin film for a transfer pattern is provided in manufacturing a mask blank) is carried out. This point is explained together with FIG. 1. FIG. 1 is a plan view of a substrate 1 viewed from one main surface P. As shown in FIG. 1, a calculation region $T_A$ which is a square region based on a center O of the substrate 1 is set, and focusing on a surface profile of the substrate 1 in the calculation region $T_A$, a mask blank substrate is selected. The calculation region $T_A$ in this embodiment is required to be a square region at least including a square region having a side of 132 mm upon which a transfer pattern is formed when a transfer mask manufactured from the substrate 1 is set on a mask stage of an exposure apparatus, and on which an exposure light is irradiated. Namely, even if the calculation region $T_A$ is a square region having a side of 132 mm, the effect of this invention can be obtained. On the other hand, the calculation region $T_A$ is preferably a region that is equal to or smaller than a square region having a side of 146 mm. This is because height information from a base plane can be acquired at a high precision up to the square region with such side length when a surface profile of a main surface of a substrate is measured with a profilometer to be mentioned below.

Next, specific points A, B, C, D are set in each region of four corner portions $C_A$ $C_B$ $C_C$ $C_D$ (borderline of the region inclusive) on the calculation region $T_A$ as in FIG. 1, in which the specific points are measurement points for measuring the height from the base plane $P_R$ (see FIG. 2) and which are necessary to set an imaginary plane to be described below. The four corner portions $C_A$ $C_B$ $C_C$ $C_D$ are, for example, square regions with an apex of the calculation region $T_A$ as a common apex and which are set inside of the calculation region $T_A$. Length of one side of the square region, which is the corner portion $C_A$, etc. is, for example, 3 mm. Within the scope of a square region having a side of 3 mm, there is little change in the height from the base plane $P_R$ of the main surface P, and so is the change of the height from the imaginary plane $P_I$ to be mentioned below when the position of the specific point A, etc. to be set in the square region is changed. The length of a side of the square which is the corner portion $C_A$, etc. is preferably 2 mm, and more preferably 1 mm. Incidentally, the specific points A, B, C, D are preferably set on each apex of the calculation region $T_A$.

Next, the step of acquiring the height from the base plane $P_R$ at at least the four specific points A, B, C, D on the main surface P is carried out. The height from the base plane $P_R$ at the four specific points A, B, C, D on the main surface P is acquired by using a profilometer. A preferable profilometer in this case is, for example, UltraFLAT 200M (manufactured by Corning TROPEL). While a profilometer analyzes an image of the acquired interference fringe image for conversion into a surface profile (height information) of the main surface P of the substrate 1 as mentioned above, the plane on which the height information is based at this stage is a reference plane of the profilometer or a plane parallel thereto. However, since a parallelism between the reference plane and the main surface of the substrate 1 depends on the positional relationship when the substrate 1 is placed on the profilometer, the parallelism is not always high. Considering this point, it is preferable to calculate a least square plane from the height information of a plurality of measurement points based on the reference plane measured by the profilometer, and converting the surface profile (height from the reference plane of each measurement point) of the main surface P into the height with the least square plane as the base plane $P_R$. This least square plane is preferably calculated from the measurement points including at least four specific points A, B, C, D.

On the other hand, other than the above specific points, a plurality of measurement points N can be set in the calculation region $T_A$, which is for measuring height from the base plane $P_R$ of the main surface P which is the surface profile of the substrate 1. While FIG. 1 only shows measurement points $N_{x-1}$, $N_x$, and $N_{x+1}$, it is preferable to set a sufficient number of measurement points to measure the surface profile of the substrate 1 of the entire calculation region $T_A$. The measurement points N are preferably arranged in grids on the main surface P of the substrate 1. A space between each measurement point N in this case is preferably 2 mm or less, and more preferably 1 mm or less. The measurement points N can be set on the main surface outside of the calculation region $T_A$.

In the above step, the height information is acquired by a profilometer after setting the calculation region $T_A$ and the specific points A, B, C, D on the main surface P of the substrate 1. However, in the case of acquiring the height information by arranging the measurement points N in grids in the measurement region of the main surface P of a size at least including the calculation region $T_A$, the height information can be acquired using the profilometer before the step of setting the calculation region $T_A$. In this case, when calculating the base plane $P_R$ which is a least square plane, it is preferable to use the height information based on a reference plane of all measurement points N in the measurement region measured by the profilometer.

Figure 2:
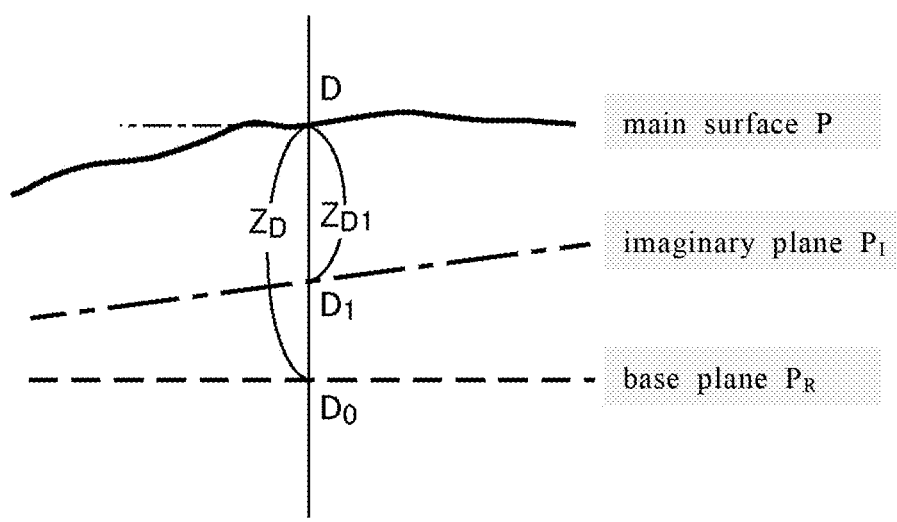
FIG. 2 is a schematic cross-sectional view showing a main surface, an imaginary plane, and a base plane of a substrate in an embodiment of this invention.

Next, the step of setting an imaginary plane $P_I$ that passes through three specific points among the specific points A, B, C, D is carried out. Subsequently, the step of setting an intersection of the imaginary plane $P_I$ and a perpendicular line that passes through a remaining specific point that was not used in setting the imaginary plane $P_I$ and which is perpendicular to the base plane $P_R$ is carried out. Further, the step of calculating the distance between the intersection and the remaining specific point is carried out. These steps are explained together with FIG. 2. FIG. 2 is a schematic cross-sectional view of the substrate 1 including the specific point D, in the case where an imaginary plane $P_I$ passing through the specific points A, B, C is set, and the specific point D is a remaining specific point. $D_0$ is an intersection of the base plane $P_R$ and a perpendicular line that passes through the remaining specific point D and which is perpendicular to the base plane $P_R$. $D_1$ is an intersection of the perpendicular line and the imaginary plane $P_I$. By subtracting the distance between $D_0$ and $D_1$ from the distance $Z_D$ between $D_0$ and D that is already acquired by a profilometer, etc., the distance $Z_{D1}$ between the remaining specific point D and the intersection $D_1$ is calculated.

Further, using the distance $Z_{D1}$ thus calculated as a new index, the step of selecting a substrate with a value that satisfies the criterion (below basic value) as a mask blank substrate is carried out. The distance $Z_{D1}$ which is a new index thus calculated is hereafter referred to as "floating distance". Incidentally, while the plane passing through the specific points A, B, C is regarded as the imaginary plane in the embodiments, a plane passing through arbitrary three specific points can be set as an imaginary plane. Further, "floating" in the name of the new index is an expression for convenience and the remaining specific point D given above does not have to float from the imaginary plane $P_I$.

As a result of investigating various correlations between the floating distance and focus error occurrence, it was found that a judging criterion of the floating distance as "less than 0.2 μm" could obtain a sufficient performance. In this invention, a substrate with a floating distance of less than 0.2 μm is selected as a mask blank substrate. By using a transfer mask manufactured from a mask blank substrate selected under such a judging criterion, focus error occurrence when an exposure transfer was carried out with an exposure apparatus with high NA can be reduced. Incidentally, it is more preferable to select a substrate having the floating distance of 0.18 μm or less as a mask blank substrate, and it is further preferable to select a substrate having the floating distance of 0.15 μm or less as a mask blank substrate. On the other hand, substrates that do not satisfy the judging criterion are returned to the polishing step, subjected to local processing steps and again judged under the floating distance, or the substrates are discarded.

Figure 3:
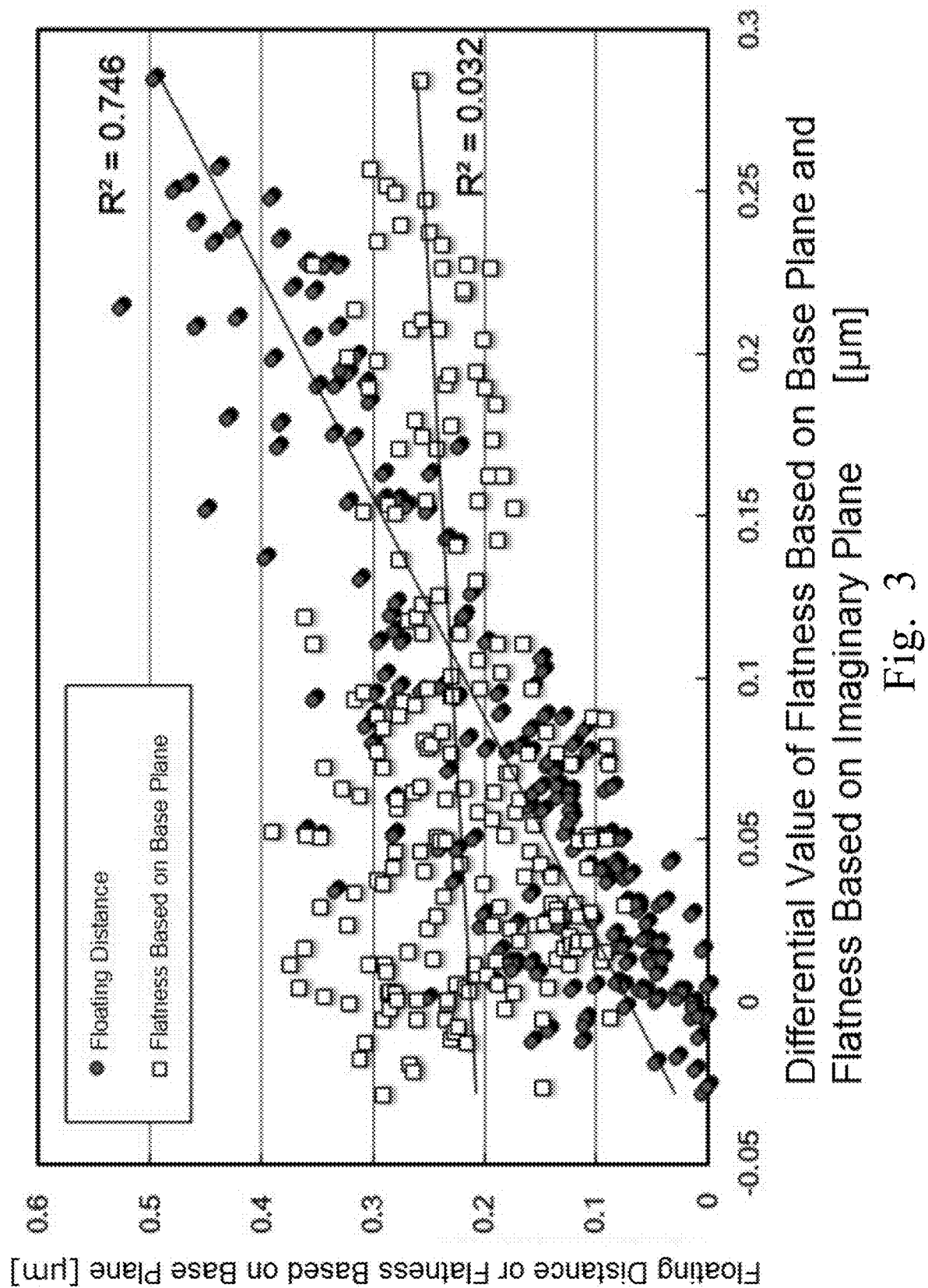
FIG. 3 shows a correlation between differential value, which is a difference between flatness based on the base plane and flatness based on the imaginary plane, and floating distance or flatness based on the base plane in an embodiment of this invention.

FIG. 3 is explained below. Two hundred substrates were prepared arbitrarily, a surface profile of a main surface P was measured for each substrate by the above procedures, a base plane $P_R$ of a least square plane was calculated, and in addition, an imaginary plane $P_I$ and a floating distance $Z_{D1}$ were calculated, respectively. Next, a flatness (TIR value) in a square region having a side of 132 mm based on the center of the substrate was calculated, which is a conventional index, for each substrate from a surface profile of the main surface P based on the base plane $P_R$. Next, a flatness (TIR value) in a square region having a side of 132 mm based on the center of the substrate was calculated for each substrate from a surface profile of the main surface P based on the imaginary plane $P_I$. Next, a difference of flatness based on base plane $P_R$ and flatness based on the imaginary plane $P_I$ was calculated for each substrate. FIG. 3 shows a graph plotting the result for the two hundred substrates, with a horizontal axis representing "Differential Value of Flatness Based on Base Plane and Flatness Based on Imaginary Plane [μm]" and a vertical axis representing "Floating Distance or Flatness Based on Base Plane [μm]".

A linear approximation function was calculated for the plot of the relationship between "Differential Value of Flatness Based on Base Plane and Flatness Based on Imaginary Plane" and "Floating Distance" (FIG. 3: plot ●), resulting in the coefficient of determination $R^2$ of the linear approximation function of 0.746, confirming a rather high correlation. From this result, it can be considered that a substrate where the imaginary plane $P_I$ passing through three specific points among the specific points of the four corner portions changes largely relative to the base plane $P_R$ of least square plane has a higher tendency of a transfer mask manufactured from the substrate being more likely for a focus error to occur. On the other hand, a linear approximation function was calculated for the plot of the relationship between "Differential Value of Flatness Based on Base Plane and Flatness Based on Imaginary Plane" and the conventional index "Flatness Based on Base Plane" (FIG. 3: plot □), resulting in the coefficient of determination $R^2$ of the linear approximation function of 0.032, and correlation could not be obtained. From this result, it was confirmed as difficult to sort the substrates with higher tendency of focus error occurrence by the conventional index of flatness.

On the other hand, the mask blank substrate of this invention is a mask blank substrate used for manufacturing a mask blank provided with a thin film for a transfer pattern on one main surface of a substrate having a pair of opposing main surfaces, the substrate is such that in setting a calculation region on one main surface, which is a square region including at least a square region having a side of 132 mm based on a center of the substrate, setting a specific point for each of four corner portions in the calculation region, acquiring a height from a base plane for all of the specific points, setting an imaginary plane passing through three of all of the specific points, setting an intersection of the imaginary plane and a perpendicular line that passes through a remaining specific point and which is perpendicular to the base plane, and calculating a distance between the remaining specific point and the intersection, the distance thus calculated (floating distance) is less than 0.2 μm. A transfer mask manufactured from a mask blank substrate having such characteristics has less chance for a focus error to occur. Similarly in this case, the floating distance of the mask blank substrate is more preferably 0.18 μm or less, and further preferably 0.15 μm or less.

In this mask blank substrate, difference obtained by subtracting minimum value from maximum value of the height from the base plane $P_R$ in the calculation region $T_A$ is greater than 0.2 μm. Namely, when a plurality of measurement points is set in the calculation region $T_A$ in the main surface P and the height of each measurement point from the base plane $P_R$ of the mask blank substrate is obtained, difference (same index as flatness (TIR)) obtained by subtracting minimum value from maximum value of the height of the specific points A, B, C, D and each measurement point from the base plane $P_R$ at the calculation region $T_A$ is greater than 0.2 μm. Generally, when a mask blank substrate having the difference greater than 0.2 μm is used for manufacturing a transfer mask and the transfer mask is set on a mask stage of an exposure apparatus, floating from the mask stage tends to increase and a focus error is likely to occur. Such a mask blank substrate is often sorted conventionally as a non-high-spec substrate. By applying the method for manufacturing a mask blank substrate of this invention to the non-high-spec substrate thus selected, it is possible to select a substrate where a focus error is unlikely to occur when exposure-transferred using an exposure apparatus with high NA, despite of being a non-high-spec substrate.

Further, the main surface P of the mask blank substrate needs to be mirror-polished to a predetermined degree or more surface roughness. The main surface P preferably has a root mean square roughness Rq of 0.25 nm or less. The calculation region of surface roughness Rq in this case is, for example, an inner region of a square having a side of 10 μm. Incidentally, a surface roughness Rq can be measured by, for example, an atomic force microscope (AFM).

[Method for Manufacturing Mask Blank and Mask Blank]

The method for manufacturing a mask blank of this invention is characterized in including the step of providing a thin film for a transfer pattern on one of the main surfaces of the mask blank substrate manufactured by the method for manufacturing a mask blank substrate described above. Further, the mask blank of this invention is characterized in providing one of the main surfaces of the mask blank substrate with a thin film for a transfer pattern.

The following structures (1) to (5) are applicable as the mask blank manufactured by the method for manufacturing a mask blank of this invention and the mask blank of this invention.

(1) A binary mask blank with a light shielding film made from a material including transition metals The binary mask blank is configured to include a light shielding film (thin film for pattern formation) on a substrate, the light shielding film being made from a material including transition metals such as chromium, tantalum, ruthenium, tungsten, titanium, hafnium, molybdenum, nickel, vanadium, zirconium, niobium, palladium, rhodium, etc. alone or in a compound. One example is a light shielding film made from chromium, or a chromium compound including chromium and one or more elements selected from oxygen, nitrogen, carbon, etc. added thereto. A further example is a light shielding film made from a tantalum compound including tantalum and one or more elements selected from oxygen, nitrogen, boron, etc. added thereto. Such a binary mask blank includes a light shielding film configured as a double layer structure of a light shielding layer and a front-surface antireflection layer, and a three layer structure having a back-surface antireflection layer between a light shielding layer and a substrate. The composition of the light shielding film in the film thickness direction may be a composition gradient film that varies continuously or in stages.

(2) A phase shift mask blank including a light-semitransmissive film made from a material including a compound of transition metal and silicon (including transition metal silicide, particularly molybdenum silicide)

As such a phase shift mask blank, a half tone phase shift mask is manufactured that is configured to have a light-semitransmissive film (thin film for pattern formation) on a substrate, the light-semitransmissive film patterned and provided with a shifter portion. In such a phase shift mask, to avoid pattern defects of the substrate to be transferred by the light-semitransmissive film pattern formed on the transfer region based on a light transmitted through the light-semitransmissive film, there is a configuration including a light-semitransmissive film on a substrate, and further a light shielding film (light shielding band) thereon. In addition to the half tone phase shift mask blank, there are mask blanks for an enhancer-type phase shift mask and for a Levenson type phase shift mask which is a substrate dug-down type where a substrate is dug by etching, etc. to provide a shifter portion.

The light-semitransmissive film is made from materials including, e.g., a compound of transition metal and silicon (including transition metal silicide), the materials including, as primary components, the transition metal and silicon, and oxygen and/or nitrogen. The transition metals include molybdenum, tantalum, tungsten, titanium, hafnium, nickel, vanadium, zirconium, niobium, palladium, ruthenium, rhodium, chromium, etc. Further, in the case of a configuration where a light shielding film is formed on a light-semitransmissive film, since the materials for the light-semitransmissive film include transition metal and silicon, the material of the light shielding film preferably includes chromium, or chromium compound including chromium and elements such as oxygen, nitrogen, and carbon having etching selectivity (having etching durability) on the light-semitransmissive film.

Since a Levenson type phase shift mask is manufactured from a mask blank with a structure similar to a binary mask blank, the structure of a thin film for pattern formation is similar to a light shielding film of a binary mask blank. While a light-semitransmissive film of a mask blank for an enhancer-type phase shift mask transmits a light having an intensity that does not substantially contribute to exposure (e.g., 1% to 30% relative to exposure wavelength), the phase difference generated on the transmitting exposure light is small (e.g., phase difference of 30 degrees or less, preferably 0 degrees), which is the difference with the light-semitransmissive film of the half tone phase shift mask blank. While the materials of this light-semitransmissive film include elements similar to those of the light-semitransmissive film of the half tone phase shift mask blank, film thickness and composition ratio of each element are adjusted to a predetermined small phase difference and a predetermined transmittance with respect to exposure light.

(3) A phase shift mask blank with a light-semitransmissive film made from a material containing a compound of silicon This light-semitransmissive film is similar to the matters regarding the light-semitransmissive film given above in (2), except for the fact that light-semitransmissive film is made from a material containing silicon and nitrogen, or a material containing silicon and nitrogen with a material including one or more elements selected from a metalloid element, a non-metallic element, and noble gas added thereto.

(4) A binary mask blank with a light shielding film including a material containing a compound of transition metal and silicon (including transition metal silicide, particularly molybdenum silicide)

The light shielding film (thin film for pattern formation) is made from materials including a compound of transition metal and silicon, the materials including, as primary components, the transition metal and silicon, and at least one or more of oxygen or nitrogen. Further, materials of the light shielding film can include, as primary components, the transition metal and at least one or more of oxygen, nitrogen, or boron. Molybdenum, tantalum, tungsten, titanium, hafnium, nickel, vanadium, zirconium, niobium, palladium, ruthenium, rhodium, chromium, etc. can be applied as the transition metal. Particularly, there are cases where the light shielding film is made from a compound of molybdenum silicide, including a two-layer structure of a light shielding layer (MoSi, etc.) and a front-surface antireflection layer (MoSiON, etc.), and a three layer structure further including a back-surface antireflection layer (MoSiON, etc.) between a light shielding layer and a substrate. The composition of the light shielding film in the film thickness direction may be a composition gradient film that varies continuously or in stages.

(5) A binary mask blank with a light shielding film including a material containing a compound of silicon This light shielding film is similar to the matters on the light shielding film given above in (1), except for the fact that light shielding film is made from a material containing silicon and nitrogen, or a material containing silicon and nitrogen with one or more elements selected from metalloid element, non-metallic element, and noble gas added thereto.

Further, for thinning the film thickness of a resist film to form a fine pattern, alight shielding film can be configured to have an etching mask film thereon. This etching mask film is preferably made from materials including chromium having etching selectivity to etching of a light shielding film including transition metal silicide, and a chromium compound including chromium and elements such as oxygen, nitrogen, and carbon added thereto. At this stage, a transfer mask can be manufactured with the etching mask film remaining on the light shielding film by providing antireflection function to the etching mask film.

In (1) to (5) above, an etching stopper film having etching durability on the light shielding film and the light-semitransmissive film can be provided between the substrate and the light shielding film, or between the light-semitransmissive film and the light shielding film. The etching stopper film can be made of a material capable of simultaneously peeling off the etching mask film in etching the etching stopper film.

On the other hand, an alternative embodiment that is applicable as a method for manufacturing a mask blank includes the steps of, on a mask blank having a thin film for a transfer pattern formed on a substrate, setting a calculation region $T_A$ on a surface of the thin film, setting specific points A, B, C, D on each of the four corner portions $C_A$ $C_B$ $C_C$ $C_D$ in the calculation region $T_A$ to calculate a floating distance through the process similar to the method for manufacturing a mask blank substrate described above, and selecting a substrate provided with a thin film having the floating distance of less than 0.2 µm as a mask blank.

Namely, the method for manufacturing a mask blank of the alternative embodiment is a method for manufacturing a mask blank provided with a thin film for a transfer pattern on one main surface of a substrate having a pair of opposing main surfaces, including the steps of setting a calculation region on a surface of a thin film of a substrate provided with the thin film, which is a square region including at least a square region having a side of 132 mm based on a center of the substrate, and setting a specific point for each of four corner portions in the calculation region; acquiring a height from a base plane for all of the specific points; setting an imaginary plane passing through three of all of the specific points, setting an intersection of the imaginary plane and a perpendicular line that passes through a remaining specific point and which is perpendicular to the base plane, and calculating a distance between the remaining specific point and the intersection; and selecting a substrate provided with the thin film having the distance thus calculated of less than 0.2 µm as a mask blank.

The thin film for the transfer pattern formed on the substrate has high uniformity in in-plane film-thickness distribution, and has a sufficiently reduced film stress. Therefore, there is little difference between the floating distance calculated by setting specific points, etc. on a thin film for a transfer pattern and the floating distance calculated by setting specific points, etc. on a main surface of a substrate, and a focus error is unlikely to occur on a transfer mask manufactured from a mask blank selected from the method for manufacturing a mask blank of the alternative embodiment. Incidentally, other matters on the method for manufacturing a mask blank of the alternative embodiment (calculating procedure of floating distance, etc.) are similar to those of the method for manufacturing a mask blank substrate.

Similarly, a mask blank of an alternative embodiment can be characterized in that when a calculation region $T_A$ is set on a surface of a thin film, specific points A, B, C, D are set on four corner portions $C_A$, $C_B$, $C_C$, $C_D$ in the calculation region $T_A$, respectively, and a floating distance is calculated through the same procedure as the mask blank substrate described above, the floating distance is less than 0.2 µm. Namely, the mask blank of this alternative embodiment is characterized in a mask blank provided with a thin film for a transfer pattern on one main surface of a substrate having a pair of opposing main surfaces, in which the mask blank is such that in setting a calculation region on a surface of the thin film, which is a square region including at least a square region having a side of 132 mm based on a center of the substrate, setting a specific point for each of four corner portions in the calculation region, acquiring a height from a base plane for all of the specific points, setting an imaginary plane passing through three of all of the specific points, setting an intersection of the imaginary plane and a perpendicular line that passes through a remaining specific point and which is perpendicular to the base plane, and calculating a distance between the remaining specific point and the intersection, the distance thus calculated is less than 0.2 µm. A transfer mask manufactured from the mask blank of this alternative embodiment will have less chance for a focus error to occur as well. Incidentally, other matters on the method for manufacturing a mask blank of this alternative embodiment (calculating procedure of floating distance, etc.) are similar to those of the mask blank of the alternative embodiment given above.

[Method for Manufacturing Transfer Mask and Transfer Mask]

The method of manufacturing a transfer mask of this invention is characterized in including the step of forming a transfer pattern on a thin film of a mask blank manufactured by the method of manufacturing a mask blank mentioned above. The transfer mask of this invention is characterized in that a transfer pattern is provided on a thin film of the mask blank mentioned above. Explanation is made below on the steps of manufacturing a transfer mask from a mask blank. The mask blank used herein is the phase shift mask blank mentioned above in (2), including a structure where a light-semitransmissive film (a thin film for a transfer pattern formation) and a light shielding film are stacked on a substrate in order. Further, the manufacturing method of this transfer mask (phase shift mask) is one example, and can be manufactured by changing apart of the procedures.

First, a resist film is formed on a light shielding film of a phase shift mask blank by spin coating, etc. A chemically amplified resist for electron beam exposure writing is preferably used for the resist film. Next, a transfer pattern to be formed on the light-semitransmissive film is exposed and drawn with an electron beam on the resist film, and a predetermined treatment such as developing is conducted to form a resist pattern having a transfer pattern. Subsequently, dry etching is conducted on the light shielding film using the resist pattern as a mask, and the transfer pattern to be formed on the light-semitransmissive film is formed on the light shielding film. After the dry etching, the resist pattern is removed. Next, dry etching is conducted on the light-semitransmissive film using the light shielding film having the transfer pattern as a mask to form a transfer pattern on the light-semitransmissive film. Subsequently, a resist film is again formed by spin coating, etc., a pattern to be formed on the light shielding film (pattern for light shielding band, etc.) is exposed and drawn with an electron beam, and a predetermined treatment such as developing is conducted to form a resist pattern. Dry etching is conducted on the light shielding film using the resist pattern having a pattern such as a light shielding band as a mask, and a pattern such as a light shielding band is created on the light shielding film. Then, a predetermined cleaning treatment, etc. is conducted so that a transfer mask (phase shift mask) is formed.

[Manufacture of Semiconductor Device]

The method for manufacturing a semiconductor device of this invention is characterized in setting each transfer mask described above on a mask stage of an exposure apparatus, and transferring a transfer pattern on a resist film on a semiconductor substrate by a lithography method. When these transfer masks are set on a mask stage of an exposure apparatus, they slightly or do not float from the chuck surface so that a focus error is unlikely to occur. Therefore, a transfer defect on a resist film on a semiconductor device can be prevented when these transfer masks are used to exposure-transfer on a resist film on a semiconductor device. Moreover, in the case where a film to be processed is dry etched to form a circuit pattern using this resist pattern as a mask, a highly precise and high-yield circuit pattern without short-circuit of wiring and disconnection caused by transfer defect can be formed.

EXAMPLES

The embodiments of this invention are described in greater detail below together with examples.

Examples, Comparative Examples

[Manufacture of Mask Blank Substrate]

First, a synthetic quartz glass substrate (size: 152.4 mm×152.4 mm, thickness: 6.35 mm) was cut out, end surfaces of which were chamfered and ground, further rough-polished and precision-polished using a polishing liquid containing cerium oxide grains. Thereafter, the glass substrate was placed in a carrier of a double side polishing apparatus and superprecision polishing was conducted under the conditions below.

polishing pad: soft polisher (suede type)
polishing liquid: colloidal silica grain (average particle size 100 nm)+water
processing pressure: 50-100 g/cm$^2$
processing time: 60 minutes After the completion of superprecision polishing, the glass substrate was immersed in a dilute hydrofluoric acid solution for cleaning to remove the colloidal silica grains. Subsequently, a main surface and an end surface of the glass substrate were scrub-cleaned, followed by spin-cleaning with pure water, and spin-dried, so that forty pieces of glass substrates 1 with polished surfaces were prepared. Root mean square roughness Rq in a calculation region of a square having a side of 10 μm of the main surfaces of the forty substrates was measured using an atomic force microscope, and the value was 0.25 nm or less in all substrates.

Next, on each of the forty glass substrates 1 thus prepared, a measurement region was set as a square having a side of 148 mm based on a center O of the substrate 1, measurement points N were set in the measurement region in grids of 256×256 points, and using a profilometer UltraFLAT 200M (Corning TROPEL), height of each measurement point from a base plane $P_R$ (least square plane), i.e., a surface profile of a main surface P, was obtained. Subsequently, the forty glass substrates 1 were separated into two groups (20 pieces for each group).

Next, on each of the twenty glass substrates 1 of one group, a calculation region $T_A$ of a square having a side of 132 mm was set, and four corner portions $C_A$, $C_B$, $C_C$, $C_D$ (square having 1 mm side with apex of calculation region $T_A$ as a common apex) were set in the calculation region $T_A$. Next, among the measurement points N in the regions of each corner portion $C_A$, $C_B$, $C_C$, $C_D$, each measurement point that is the closest to the apex of the calculation region $T_A$ was set as four specific points A, B, C, D.

For each glass substrate 1, an imaginary plane $P_I$ passing through three specific points A, B, C of the four specific points A, B, C, D was calculated. Next, a perpendicular line passing through the remaining specific point D and which is perpendicular to the base plane $P_R$ was set, and an intersection $D_1$ of the perpendicular line and the imaginary plane $P_I$ was calculated. Further, a floating distance $Z_{D1}$ which is a distance between the remaining specific point D and the intersection $D_1$ was calculated. This floating distance $Z_{D1}$ is calculated by calculating the distance between an intersection Do of the perpendicular line and the base plane $P_R$ and the intersection $D_1$ of the perpendicular line and the imaginary plane $P_I$, and subtracting the distance from a height $Z_D$ of the specific point D from the base plane $P_R$.

Figure 4:
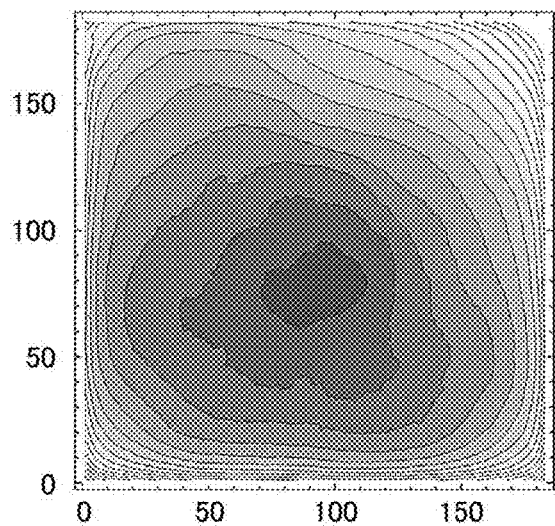
FIG. 4 shows a contour distribution, etc. of a main surface of substrate A1 in Example 1.
Figure 4:
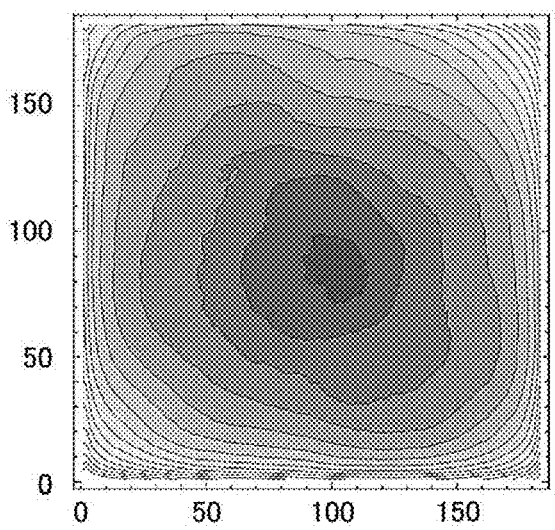
Figure 4:
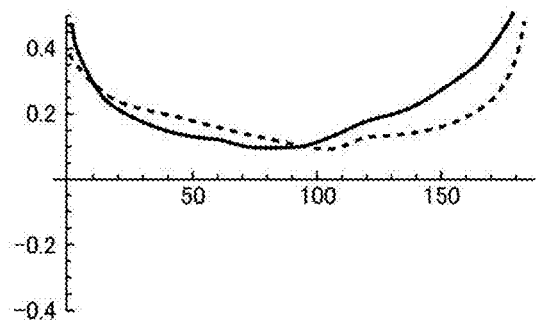
Figure 4:
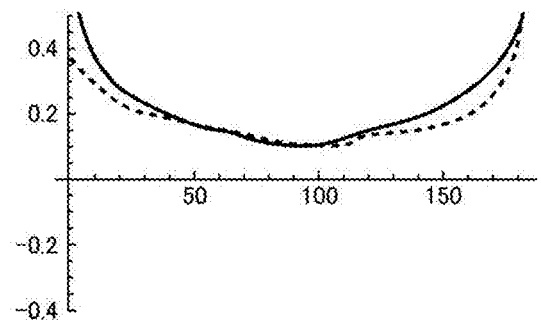
Figure 4:
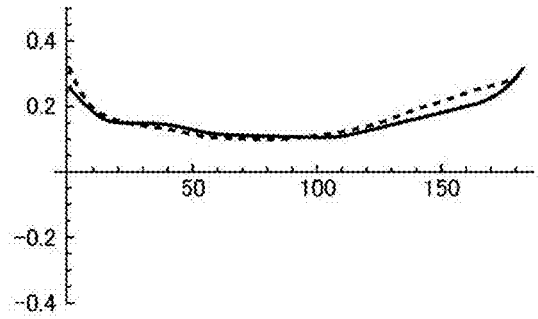
Figure 4:
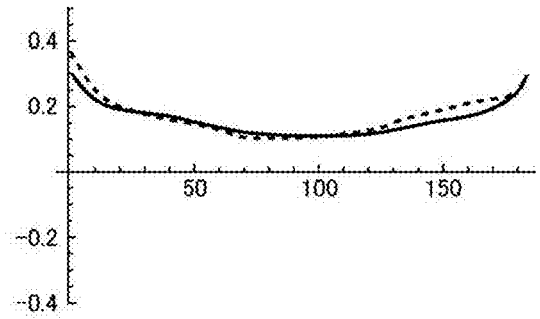
Figure 5:
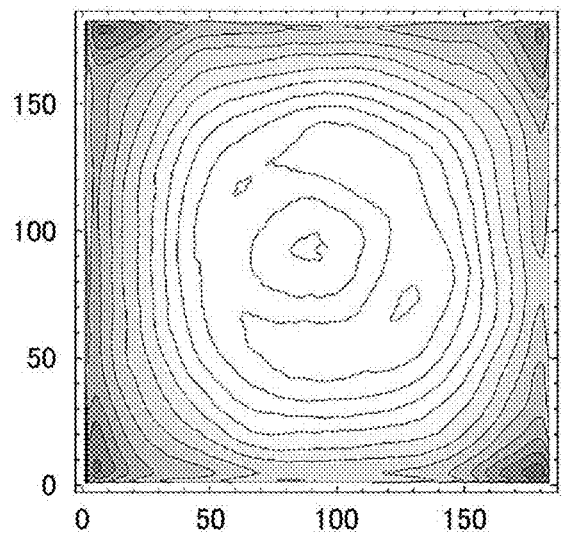
FIG. 5 shows a contour distribution, etc. of a main surface of substrate A2 in Example 2.
Figure 5:
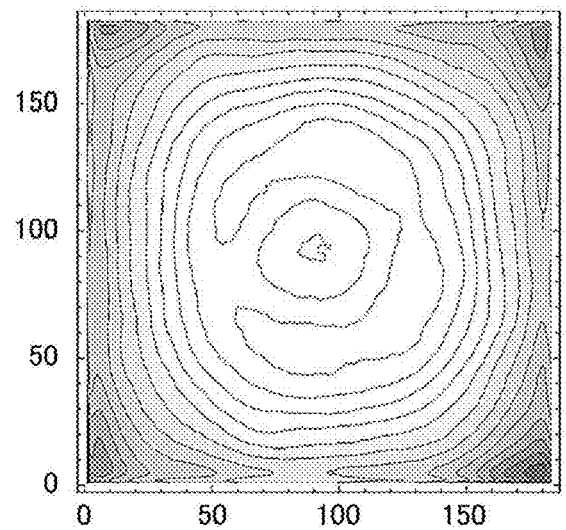
Figure 5:
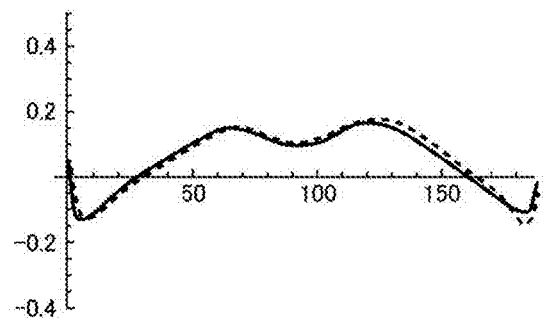
Figure 5:
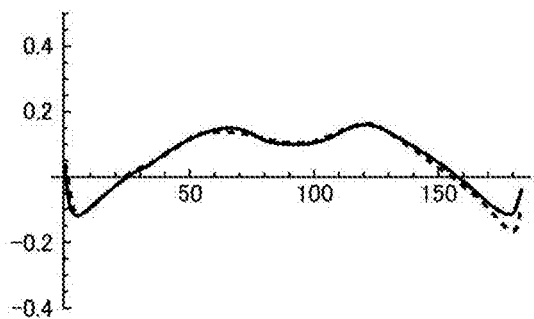
Figure 5:
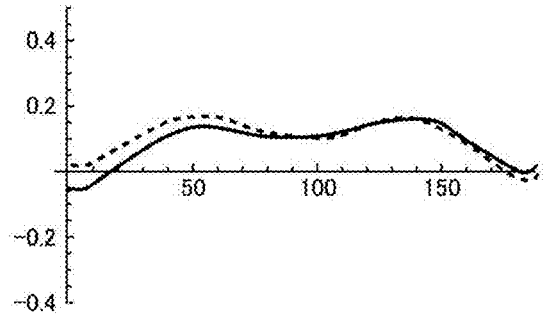
Figure 5:
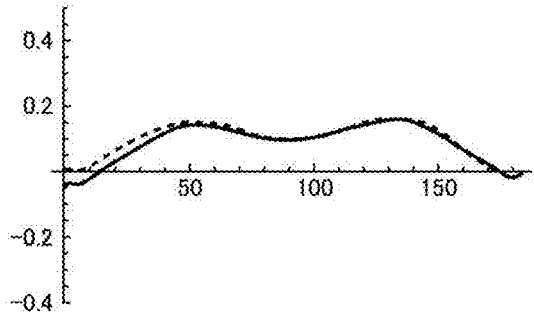
Figure 6:
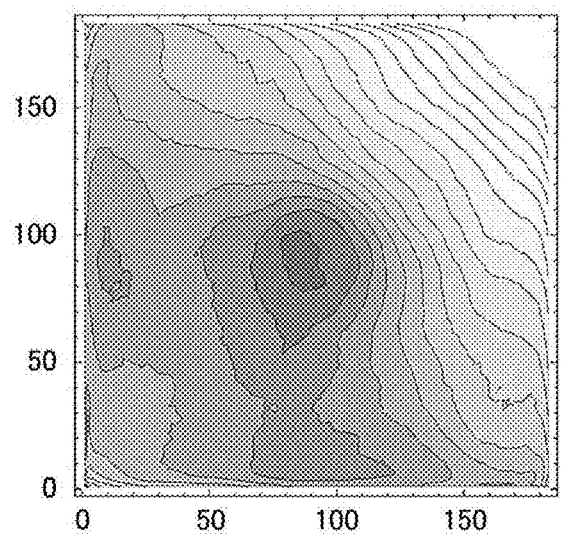
FIG. 6 shows a contour distribution, etc. of a main surface of substrate B1 in Comparative Example 1.
Figure 6:
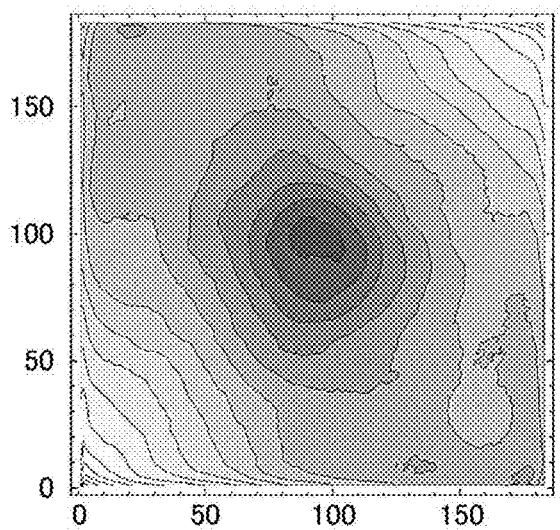
Figure 6:
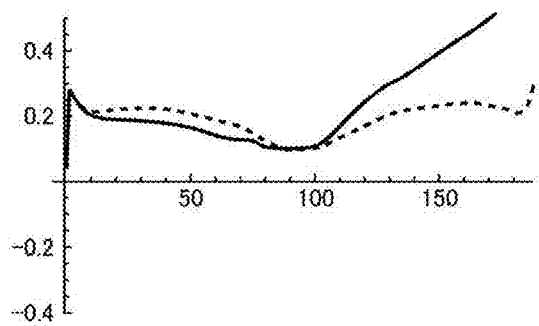
Figure 6:
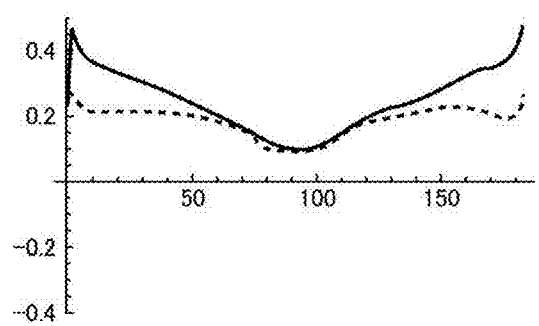
Figure 6:
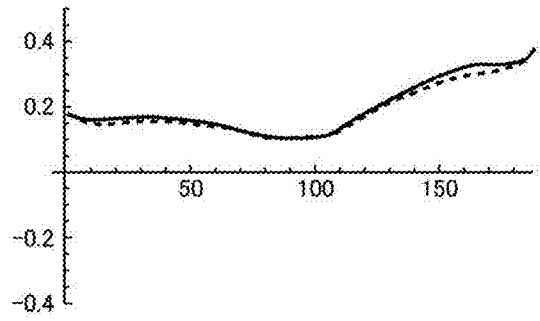
Figure 6:
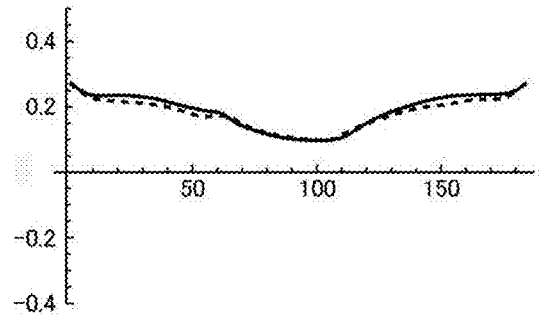

The step of selecting a mask blank substrate was carried out on the twenty glass substrates 1 of one group, with the floating distance $Z_{D1}$ of less than 0.2 µm as a selecting criterion. Among the glass substrates 1 that satisfied the selecting criterion, a glass substrate A1 (Example 1) is shown in FIG. 4, and a glass substrate A2 (Example 2) is shown in FIG. 5. Further, among the glass substrates that could not satisfy the selecting criterion, a glass substrate B1 (Comparative Example 1) is shown in FIG. 6. In FIG. 4 to FIG. 6, (a) is a contour distribution diagram of the main surface P viewed from the top regarding height information (surface profile) of the main surface P based on the imaginary plane $P_I$, (b) is a cross-sectional view of height distribution in a diagonal direction (solid line is a height distribution of a cross-section of the contour distribution diagram (a) cut along a diagonal line sloping up to the right, broken line is a height distribution of a cross-section of the contour distribution diagram (a) cut along a diagonal line sloping down to the right), and (c) is a cross-sectional view of a height distribution in vertical and horizontal directions (solid line is a height distribution of a cross-section of the contour distribution diagram (a) cut horizontally through the center, broken line is a height distribution of a cross-section of the contour distribution diagram (a) cut vertically through the center).

Further, (a') in FIG. 4 to FIG. 6 is a contour distribution diagram of the main surface P viewed from the top regarding height information (surface profile) of the main surface P based on a base plane (least square plane) $P_R$, (b') is a cross-sectional view of height distribution in a diagonal direction (solid line is a height distribution of a cross-section of the contour distribution diagram (a') cut along a diagonal line sloping up to the right, broken line is a height distribution of a cross-section of the contour distribution diagram (a') cut along a diagonal line sloping down to the right), and (c') is a cross-sectional view of a height distribution in vertical and horizontal directions (solid line is a height distribution of a cross-section of the contour distribution diagram (a') cut horizontally through the center, broken line is a height distribution of a cross-section of the contour distribution diagram (a') cut vertically through the center).

Incidentally, the contour line of each contour distribution diagram is at a pitch of 25 nm, the horizontal axis and the vertical axis of each contour distribution diagram are pixel numbers applied by the profilometer, and the vertical axes (b), (c), (b'), (c') show heights in the unit of µm (same for the following drawings).

The floating distance of $Z_{D1}$ of the glass substrate A1 (Example 1) is 0.145 µm and the floating distance $Z_{D1}$ of the glass substrate A2 (Example 2) is 0.028 µm, satisfying the selecting criterion of less than 0.2 µm; whereas the floating distance $Z_{D1}$ of the glass substrate B1 (Comparative Example 1) is 0.480 µm, significantly exceeding the selecting criterion. On the other hand, under the conventional index of flatness using height information based on base plane $P_R$ (difference of maximum height and minimum height in inner region of a square having a side of 132 mm based on center O of the substrate), the value for the glass substrate A1 (Example 1) is 0.289 µm, the glass substrate A2 (Example 2) is 0.311 µm, and the glass substrate B1 (Comparative Example 1) is 0.279 µm. From this result, it is understood as difficult to exclude a substrate where a focus error is likely to occur from the mask blank substrate under the conventional index of flatness.

Flatness (difference of maximum height and minimum height in inner region of a square having a side of 132 mm based on center O of the substrate) was calculated using height information based on the imaginary plane $P_I$, and the value for the glass substrate A1 (Example 1) is 0.362 µm, the glass substrate A2 (Example 2) is 0.294 µm, and the glass substrate B1 (Comparative Example 1) is 0.439 µm. From this result, it is understood as difficult to exclude a substrate where a focus error is likely to occur from the mask blank substrate under this index as well.

Next, on each of the twenty glass substrates 1 of the other group, a calculation region $T_A$ of a square having a side of 146 mm was set, and four corner portions $C_A$, $C_B$, $C_C$, $C_D$ (square having 1 mm side with apex of calculation region $T_A$ as a common apex) were set in the calculation region $T_A$. Next, among the measurement points N in the regions of each corner portion $C_A$, $C_B$, $C_C$, $C_D$, each measurement point that is the closest to the apex of the calculation region $T_A$ was set as four specific points A, B, C, D. The floating distance $Z_{D1}$ of the twenty glass substrates 1 of the other group was calculated through the same procedure as the glass substrates of the one group.

Figure 7:
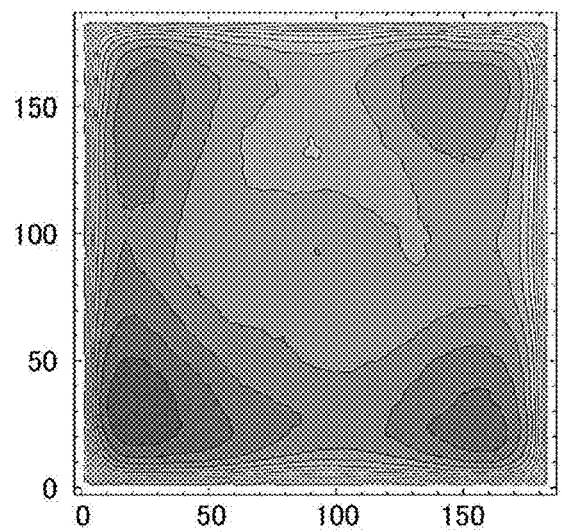
FIG. 7 shows a contour distribution, etc. of a main surface of substrate A3 in Example 3.
Figure 7:
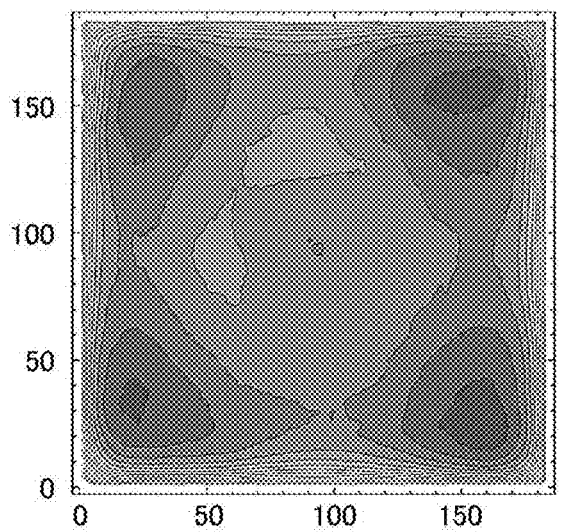
Figure 7:
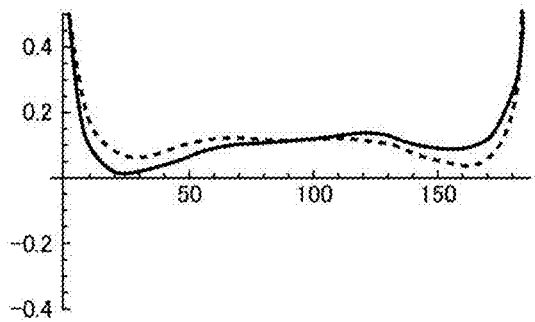
Figure 7:
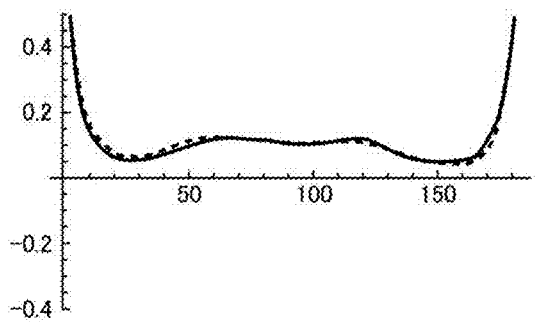
Figure 7:
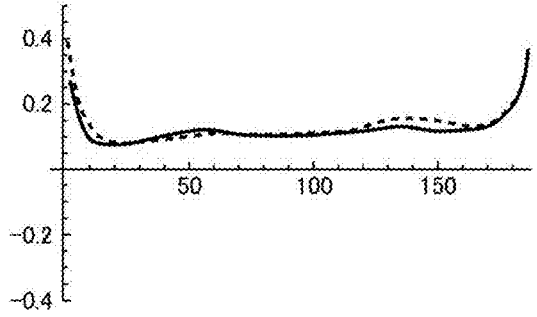
Figure 7:
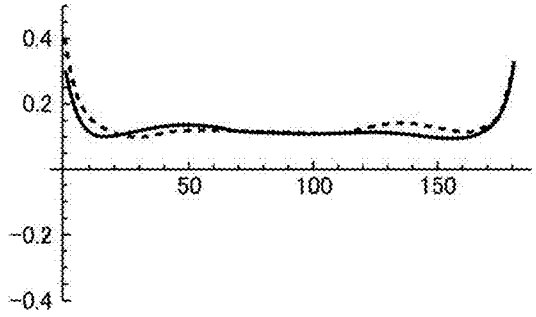
Figure 8:
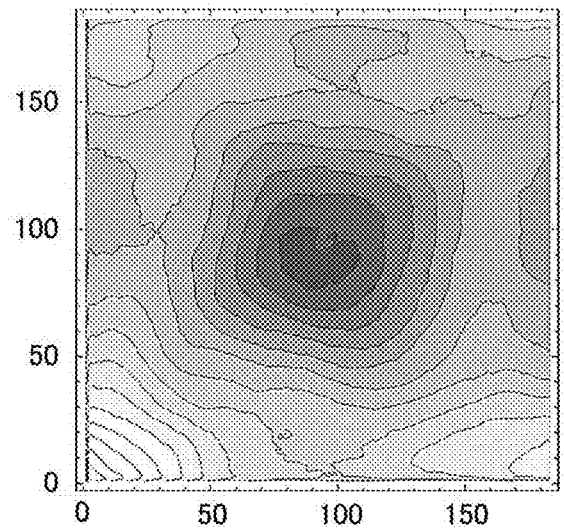
FIG. 8 shows a contour distribution, etc. of a main surface of substrate A4 in Example 4.
Figure 8:
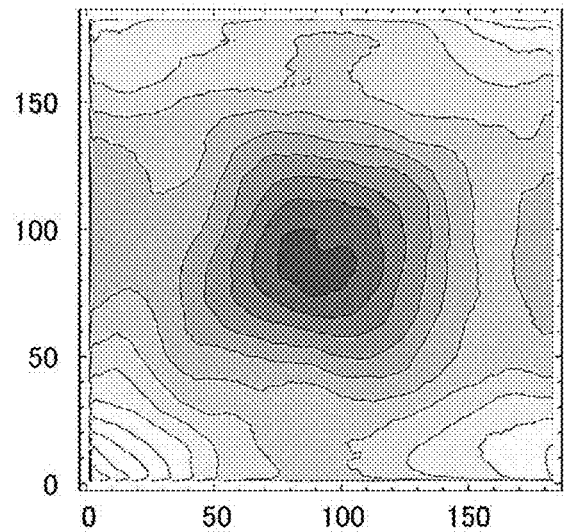
Figure 8:
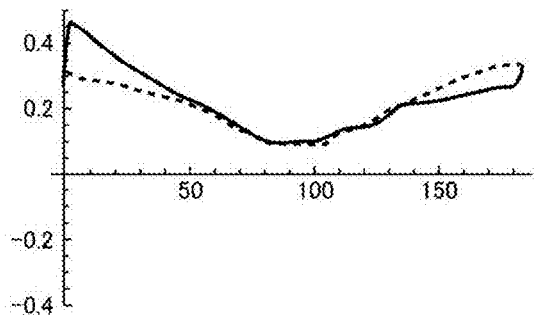
Figure 8:
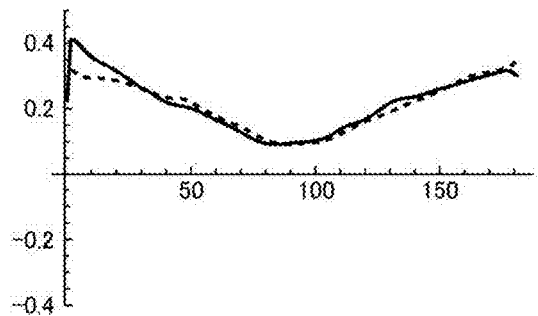
Figure 8:
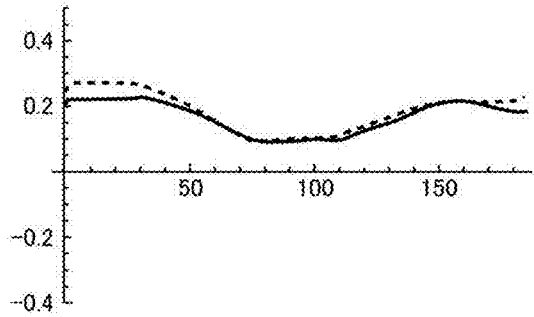
Figure 8:
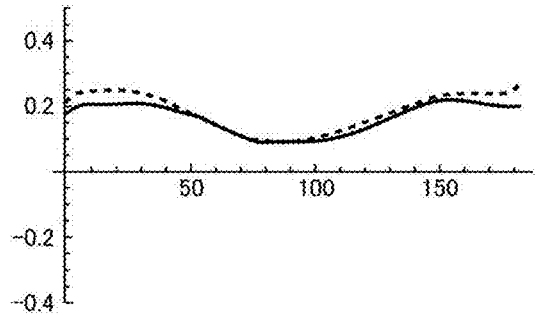
Figure 9:
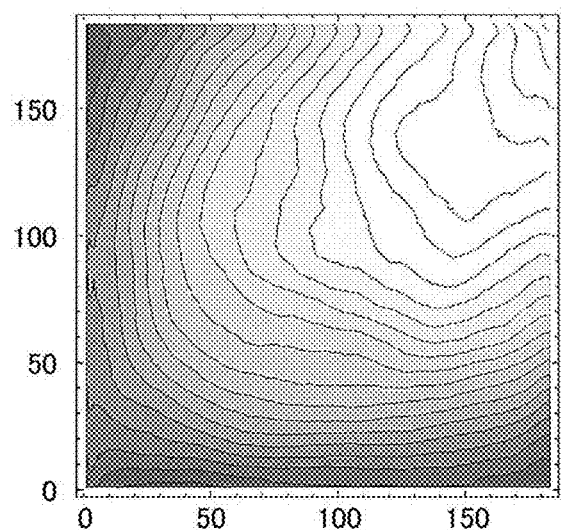
FIG. 9 shows a contour distribution, etc. of a main surface of substrate B2 in Comparative Example 2.
Figure 9:
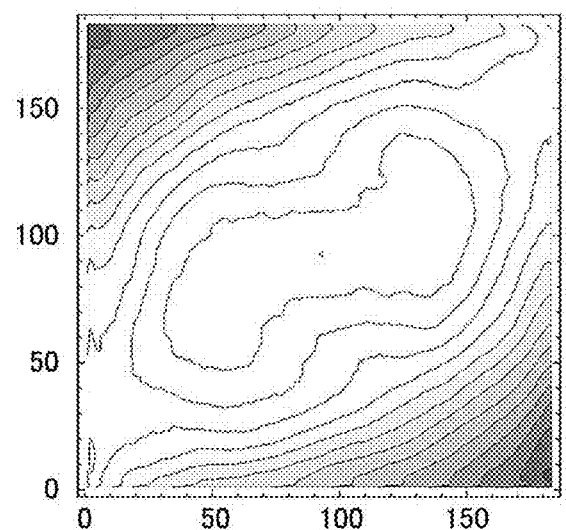
Figure 9:
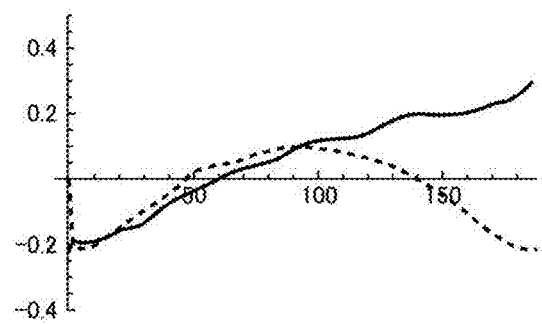
Figure 9:
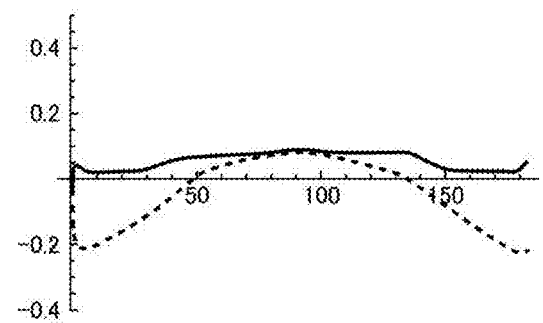
Figure 9:
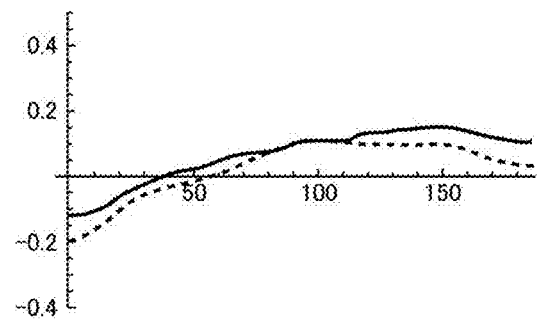
Figure 9:
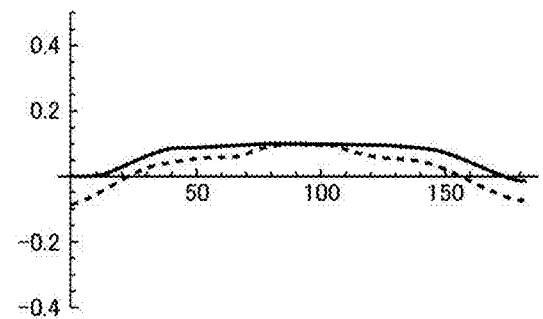

The step of selecting a mask blank substrate was carried out on the twenty glass substrates 1 of the other group, with the floating distance $Z_{D1}$ of less than 0.2 µm as a selecting criterion. Among the glass substrates that satisfied the selecting criterion, a glass substrate A3 (Example 3) is shown in FIG. 7, and a glass substrate A4 (Example 4) is shown in FIG. 8. Further, among the glass substrates that did not satisfy the selecting criterion, a glass substrate B2 (Comparative Example 2) is shown in FIG. 9.

The floating distance of $Z_{D1}$ of the glass substrate A3 (Example 3) is 0.047 µm and the floating distance $Z_{D1}$ of the glass substrate A4 (Example 4) is 0.028 µm, satisfying the selecting criterion of less than 0.2 µm; whereas the floating distance $Z_{D1}$ of the glass substrate B2 (Comparative Example 2) is 0.525 µm, significantly exceeding the selecting criterion. On the other hand, under the conventional index of flatness using height information based on base plane $P_R$ (difference of maximum height and minimum height in inner region of a square having a side of 146 mm based on center 0 of the substrate), the value for the glass substrate A3 (Example 3) is 0.565 µm, the glass substrate A4 (Example 4) is 0.386 µm, and the glass substrate B2 (Comparative Example 2) is 0.537 µm. From this result, it is understood as difficult to exclude a substrate where a focus error is likely to occur from the mask blank substrate under the conventional index of flatness.

The flatness (difference of maximum height and minimum height in inner region of a square having a side of 146 mm based on center O of the substrate) was calculated using the height information based on the imaginary plane $P_I$, resulting in the value of the glass substrate A3 (Example 3) of 0.553 µm, the glass substrate A4 (Example 4) of 0.339 µm, and the glass substrate B2 (Comparative Example 2) of 0.342 µm. From this result, it is understood as difficult to exclude a substrate where a focus error is likely to occur from the mask blank substrates under this index as well.

[Manufacture of Mask Blank]

Next, using the mask blank substrate A1 (Example 1), A2 (Example 2), A3 (Example 3), and A4 (Example 4) of each of the Examples, a mask blank for a half tone phase shift mask of each Example was manufactured respectively through the following procedures. Similarly, using the substrates B1 (Comparative Example 1) and B2 (Comparative Example 2) of each Comparative Example, a mask blank for a half tone phase shift mask of each Comparative Example was manufactured, respectively.

Concretely, a light-semitransmissive film made from nitrided molybdenum and silicon was formed on each substrate. Concretely, using a mixed target of molybdenum (Mo) and silicon (Si) (Mo:Si=10 mol %:90 mol %), a MoSiN film made of molybdenum, silicon, and nitrogen was formed with a film thickness of 69 nm under a mixed gas atmosphere of argon (Ar), nitrogen ($N_2$), and helium (He) (gas flow ratio Ar:$N_2$:He=5:49:46) with 0.3 Pa gas pressure and 3.0 kW electric power of DC power source, by reactive sputtering (DC sputtering). Next, a glass substrate 1 having the MoSiN film formed thereon was subjected to heat treatment using a furnace in the atmosphere at a heating temperature of 450° C. for one hour of heating time. Incidentally, this MoSiN film had a transmittance of 6.16% and phase difference of 184.4 degrees by an ArF excimer laser.

Next, a light shielding film was formed on the light-semitransmissive film. Concretely, using a chromium (Cr) target as a sputtering target, a CrOCN layer with a film thickness of 30 nm was formed under a mixed gas atmosphere of argon (Ar), carbon dioxide ($CO_2$), nitrogen ($N_2$), and helium (He) (gas pressure 0.2 Pa, gas flow ratio Ar:$CO_2$:$N_2$:He=20:35:10:30) with 1.7 kW electric power of DC power source, by reactive sputtering (DC sputtering). Subsequently, a CrN layer with a film thickness of 4 nm was formed under a mixed gas atmosphere of argon (Ar) and nitrogen ($N_2$) (gas pressure 0.1 Pa, gas flow ratio Ar:$N_2$=25:5) with 1.7 kW electric power of DC power source, by reactive sputtering (DC sputtering). Finally, a CrOCN layer with a film thickness of 14 nm was formed under a mixed gas atmosphere of argon (Ar), carbon dioxide ($CO_2$), nitrogen ($N_2$), and helium (He) (gas pressure 0.2 Pa, gas flow ratio Ar:$CO_2$:$N_2$:He=20:35:5:30) with 1.7 kW electric power of DC power source, by reactive sputtering (DC sputtering), and a chromium-based light shielding film of a three-layer stacked structure was formed with a total film thickness of 48 nm. Thereafter, a heating treatment of 280° C. was applied for 15 minutes, film stress was reduced down to near zero, and each mask blank of Examples 1, 2, 3, and 4 and Comparative Examples 1 and 2 was obtained.

[Manufacture of Transfer Mask]

Next, a pattern was formed on a thin film on each mask blank of Examples 1, 2, 3, and 4 and Comparative Examples 1 and 2 to manufacture a half tone phase shift mask (transfer mask). Explanation on the manufacturing steps of the transfer mask is omitted for being identical to the method described in [Method for Manufacturing Transfer Mask and Transfer Mask].

[Evaluation of Exposure Transfer Performance]

On each of the half tone phase shift masks of Examples 1, 2, 3, and 4 and Comparative Examples 1 and 2 manufactured by the above procedures, a simulation of a transfer image was made when an exposure transfer was made on a resist film on a wafer under an exposure condition of high NA (liquid immersion exposure) using AIMS193 (manufactured by Carl Zeiss) at an exposure light of 193 nm wavelength. The simulated exposure transfer image was inspected, resulting in that each of the half tone phase shift masks of Examples 1, 2, 3, and 4 had high resolution of the exposure transfer image, and pattern defect, etc. considered as caused by a focus error was not found. In view of these results, it can be considered that a confirmation was made that there is no focus error occurrence even if the half tone phase shift masks of Examples 1, 2, 3, and 4 were set on a mask stage of an exposure apparatus and a resist film on a wafer was exposure-transferred.

On the contrary, there were regions with low resolution in the exposure transfer images in the case of each of the half tone phase shift masks of the Comparative Examples 1 and 2, and there were many pattern defects, etc. considered as caused by a focus error. In view of these results, it can be considered that there is a high risk of focus error occurrence when the half tone phase shift masks of Comparative Examples 1 and 2 were set on a mask stage of an exposure apparatus and a resist film on a wafer was exposure-transferred.

This invention is not limited to the structures explained above in the embodiments, but various changes and modifications can be made within the scope of not departing from other structures of this invention.

EXPLANATION OF REFERENCE NUMERALS

1: substrate
$C_A$ $C_B$ $C_C$ $C_D$: corner portion
A B C D: specific point
O: center of substrate
N: measurement point
P: main surface
$P_I$: imaginary plane
$P_R$: base plane

The invention claimed is:

1. A mask blank substrate used for manufacturing a mask blank, provided with a thin film for a transfer pattern on one main surface of a substrate having a pair of opposing main surfaces, the mask blank substrate comprising:
the substrate having the pair of opposing main surfaces, including the one main surface,
wherein a difference between a height, from a base plane of the one main surface, of a first measurement point among a plurality of measurement points on the one main surface and a height, from the base plane, of a second measurement point among the plurality of measurement points is greater than 0.2 µm, the plurality of measurement points being within a square calculation region on the one main surface, the calculation region having four corner portions and including at least a square region having a side of 132 mm based on a center of the substrate, and
wherein a floating distance of the substrate is less than 0.2 µm, the floating distance being a distance, along a line that passes through a specific point of a first corner portion of the four corner portions and is perpendicular to the base plane, between the specific point of the first corner portion and a intersection of the line with an imaginary plane, the imaginary plane being a plane that passes through a specific point of a second corner portion of the four corner portions, through a specific point of a third corner portion of the four corner portions, and through a specific point of a fourth corner portion of the four corner portions.

2. The mask blank substrate according to claim 1, wherein the calculation region is equal to or smaller than a square region having a side of 146 mm based on a center of the substrate.

3. The mask blank substrate according to claim 1, wherein the base plane is a least square plane that is based on height information of each of the plurality of measurement points, and
wherein a basis of the height information of each of the plurality of measurement points is a reference plane of a profilometer.

4. The mask blank substrate according to claim 1, wherein the one main surface has a root mean square roughness Rq of 0.25 nm or less.

5. A mask blank comprising the thin film for the transfer pattern on the one main surface of a mask blank substrate according to claim 1.

6. A transfer mask provided with a transfer pattern on the thin film of the mask blank according to claim 5.

7. A method for manufacturing a semiconductor device comprising setting a transfer mask according to claim 6 on a mask stage of an exposure apparatus, and transferring a transfer pattern of the transfer mask to a semiconductor substrate by a lithography method.

8. A mask blank comprising:

a substrate having a pair of opposing main surfaces, a thin film for a transfer pattern on one main surface of the pair of opposing main surfaces of the substrate, wherein a difference between a height, from a base plane of a surface of the thin film, of a first measurement point among a plurality of measurement points on the surface of the thin film and a height, from the base plane, of a second measurement point among the plurality of measurement points is greater than 0.2 μm, the plurality of measurement points being within a square calculation region on the surface of the thin film, the calculation region having four corner portions and including at least a square region having a side of 132 mm based on a center of the substrate, and wherein a floating distance of the mask blank is less than 0.2 μm, the floating distance being a distance, along a line that passes through a specific point of a first corner portion of the four corner portions and is perpendicular to the base plane, between the specific point of the first corner portion and a intersection of the line with an imaginary plane, the imaginary plane being a plane that passes through a specific point of a second corner portion of the four corner portions, through a specific point of a third corner portion of the four corner portions, and through a specific point of a fourth corner portion of the four corner portions.

9. The mask blank according to claim 8, wherein the calculation region is equal to or smaller than a square region having a side of 146 mm based on a center of the substrate.

10. The mask blank according to claim 8, wherein the base plane is a least square plane that is based on height information of each of the plurality of measurement points, and wherein a basis of the height information of each of the plurality of measurement points is a reference plane of a profilometer.

11. A transfer mask provided with a transfer pattern on the thin film of the mask blank according to claim 8.

12. A method for manufacturing a semiconductor device comprising setting a transfer mask according to claim 11 on a mask stage of an exposure apparatus, and transferring a transfer pattern of the transfer mask to a semiconductor substrate by a lithography method.

* * * * *